United States Patent
Ito et al.

(10) Patent No.: US 6,975,033 B2
(45) Date of Patent: Dec. 13, 2005

(54) SEMICONDUCTOR DEVICE AND METHOD FOR MANUFACTURING THE SAME

(75) Inventors: Sachiyo Ito, Yokohama (JP); Masahiko Hasunuma, Yokohama (JP); Takashi Kawanoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 276 days.

(21) Appl. No.: 10/247,378

(22) Filed: Sep. 20, 2002

(65) Prior Publication Data

US 2003/0116854 A1 Jun. 26, 2003

(30) Foreign Application Priority Data

Dec. 26, 2001 (JP) ........................................ 2001-395237

(51) Int. Cl.[7] .............................................. H01L 23/48
(52) U.S. Cl. ...................... 257/761; 257/758; 257/759; 257/760; 257/774
(58) Field of Search ............................... 257/758, 759, 257/760, 761, 774

(56) References Cited

U.S. PATENT DOCUMENTS

| | | | |
|---|---|---|---|
| 5,236,869 A | 8/1993 | Takagi et al. | |
| 5,942,799 A | 8/1999 | Danek et al. | |
| 6,130,156 A | 10/2000 | Havemann et al. | |
| 6,229,211 B1 | 5/2001 | Kawanoue et al. | |
| 6,348,402 B1 | 2/2002 | Kawanoue et al. | |
| 6,559,548 B1 * | 5/2003 | Matsunaga et al. | 257/774 |

FOREIGN PATENT DOCUMENTS

| | | |
|---|---|---|
| JP | 9-306988 | 11/1997 |
| JP | 9-312291 | 12/1997 |
| JP | 10-284600 | 10/1998 |
| JP | 11-54621 | 2/1999 |
| JP | 11-340330 | 12/1999 |
| JP | 2000-49116 | 2/2000 |
| JP | 2000-106397 | 4/2000 |
| JP | 2000-260770 | 9/2000 |
| JP | 2000-269213 | 9/2000 |
| JP | 2000-294634 | 10/2000 |
| JP | 2001-35917 | 2/2001 |
| JP | 2003-520448 | 7/2003 |

OTHER PUBLICATIONS

Kirchner et al.; "Ultra Thin Sacrificial Diffusion Barriers—Control of Diffusion Across the Cu–SiO$_2$ Interface"; Mat. Res. Soc. Symp. Proc. vol. 318, pp. 319–322, (1994).

Korean Patent Office Action dated Dec. 13, 2004, issued in counterpart application KR 10–2002–0083208.

Chinese Patent Office Action dated Dec. 3, 2004, issued in counterpart application CN 021568146.

* cited by examiner

*Primary Examiner*—Richard Elms
*Assistant Examiner*—Douglas Menz
(74) *Attorney, Agent, or Firm*—Finnegan, Henderson, Farabow, Garrett & Dunner, L.L.P.

(57) ABSTRACT

A semiconductor device includes a semiconductor substrate on which an element is formed, a low dielectric constant insulation film formed over the semiconductor substrate and having a relative dielectric constant of 3 or lower, a plug and a wiring layer buried in the low dielectric constant insulation film, and a high Young's modulus insulation film having a Young's modulus of 15 GPa or higher and formed in contact with a side of the plug between the low dielectric constant insulation film and the plug.

16 Claims, 10 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2001-395237, filed Dec. 26, 2001, the entire contents of which are incorporated herein by reference.

BACKGROUND OF THE INVENTION

1. Field of the Invention

The present invention relates to a semiconductor device having a multilayer wiring structure using a low-dielectric-constant interlayer insulation film, and a method for manufacturing the semiconductor device.

2. Description of the Related Art

Materials having a relative dielectric constant of 3 or lower have recently been used for low dielectric constant interlayer insulation films in order to increase the operation speed of an LSI. The Young's modulus of such a low dielectric constant insulation film is generally about 10 GPa or lower. The coefficient of linear expansion of Cu used as wiring materials is as large as about 16 ppm. However, when a Cu wiring layer is formed, a barrier metal layer comprising refractory metal such as Ta and Ti and a compound thereof, is formed between the Cu wiring layer and an interlayer insulation film. The coefficient of linear expansion of barrier metal is not larger than 10 ppm and smaller than that of Cu. Thus, a great thermal stress is exerted on the barrier metal layer due to a difference in coefficient of linear expansion between barrier metal and Cu wiring layer during a high-temperature process such as annealing and sintering.

If the Young's modulus of the low-dielectric-constant insulation film is sufficiently large, the stress applied to the barrier metal layer can be decreased by suppressing the thermal expansion of Cu. However, the Young's modulus of the low dielectric constant insulation film is about 10 GPa or lower, as described above. Therefore, the thermal stress applied to the barrier metal layer becomes great and causes a crack to the low dielectric constant insulation film.

It is around a via hole that such a crack is most likely to occur. Referring to FIGS. 1A to 1C, a problem of the crack in the wiring structure of a prior art semiconductor device will be described.

As shown in FIG. 1A, an insulation film 1 having a laminated structure of a low dielectric constant insulation film 1a and a high fracture strength cap insulation film 1b is formed on a semiconductor substrate 24 and a lower wiring layer 2 is buried in the insulation film 1 with a barrier metal layer 9 interposed therebetween. An etching stopper insulation film 3, a low dielectric constant insulation film 4, and a high fracture strength cap insulation film 5 are formed in sequence. As shown in FIG. 1B, a via hole 6 connected to the lower wiring layer 2 and a wiring groove 7 are formed in the insulation films 3, 4 and 5 by RIE (reactive ion etching). Then, the surface of the low dielectric constant insulation film 4 is damaged by the RIE to form a low fracture strength damaged layer 8.

After that, as shown in FIG. 1C, barrier metal is deposited in the via hole 6 and on the entire surface of the wiring groove 7 by sputtering. The barrier metal layer 9 formed on the sidewalls of the via hole 6 is thinner than that formed on the sidewalls and bottom of the wiring groove 7 and the bottom of the via hole 6. Then, conductive materials 10 such as Cu are deposited and the resultant structure is annealed at high temperature. During the high temperature annealing, a tensile stress is exerted on the barrier metal layer 9 due to a difference in coefficient of linear expansion between them.

Since, in particular, the barrier metal layer 9 formed on the sidewalls of the via hole 6 is thin, it is likely to be cracked by the tensile stress. The fracture strength of the damaged layer 8 that is formed in contact with the barrier metal layer 9 is low and thus the crack caused in the barrier metal layer 9 might come into the low dielectric constant insulation film 4 through the damaged layer 8. Consequently, the conductive materials 10 such as Cu, which are compressed at high temperature, are protruded from the crack and a short circuit will occur.

BRIEF SUMMARY OF THE INVENTION

A semiconductor device according to one aspect of the present invention comprises:

a semiconductor substrate on which an element is formed;

a low dielectric constant insulation film formed over the semiconductor substrate and having a relative dielectric constant of 3 or lower;

a plug and a wiring layer buried in the low dielectric constant insulation film; and a high Young's modulus insulation film having a Young's modulus of 15 GPa or higher and formed in contact with a side of the plug between the low dielectric constant insulation film and the plug.

A method for manufacturing a semiconductor device according to one aspect of the present invention, comprises:

forming a lower wiring layer over a semiconductor substrate with an insulation film interposed therebetween, an element being formed on the semiconductor substrate;

forming a low dielectric constant insulation film having a relative dielectric constant of 3 or lower on the lower wiring layer;

forming a via hole in the low dielectric constant insulation film;

forming a high Young's modulus insulation film having a Young's modulus of 15 GPa or higher on a sidewall of the via hole;

forming a wiring groove in the low dielectric constant insulation film with the via hole on the sidewall of which the high Young's modulus insulation film is formed;

depositing a barrier metal and a conductive material in sequence on a surface of the low dielectric constant insulation film in which the via hole and the wiring groove are formed, such that the barrier metal and the conductive material are electrically connected to the lower wiring layer; and removing the barrier metal and the conductive material deposited outside the via hole and the wiring groove to form a plug and an upper wiring layer each having a barrier metal layer on a surface thereof in the via hole and the wiring groove, respectively.

A method for manufacturing a semiconductor device according to one aspect of the present invention, comprises:

forming a lower wiring layer over a semiconductor substrate with an insulation film interposed therebetween, an element being formed on the semiconductor substrate;

forming a low dielectric constant insulation film having a relative dielectric constant of 3 or lower on the lower wiring layer;

forming a via hole and a wiring groove in the low dielectric constant insulation film;

forming a high Young's modulus insulation film on a surface of the low dielectric constant insulation film in which the via hole and the wiring groove are formed, the high Young's modulus insulation film having a Young's modulus of 15 GPa or higher and including a metal oxide containing at least one metal selected from a group consisting of Ta, Ti, Nb and Al;

depositing a conductive material on a surface of the low dielectric constant insulation film in which the high Young's modulus insulation film is formed, such that the conductive material is electrically connected to the lower wiring layer; and removing the conductive material deposited outside the via hole and the wiring groove to form a plug and an upper wiring layer in the via hole and the wiring groove, respectively.

DETAILED DESCRIPTION OF THE INVENTION

Embodiments of the present invention will now be described in detail with reference to the accompanying drawings.

(First Embodiment)

Figure 1A:
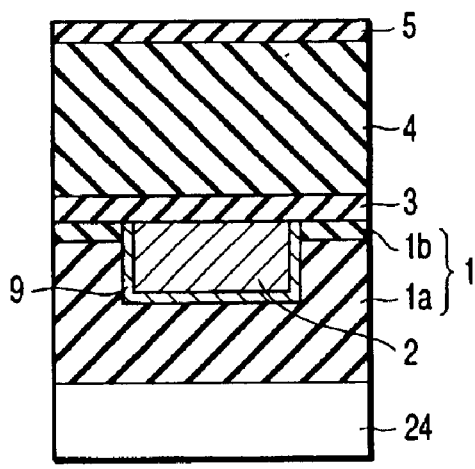
FIGS. 1A to 1C are cross-sectional views of steps of manufacturing a wiring structure of a prior art semiconductor device.
Figure 1B:
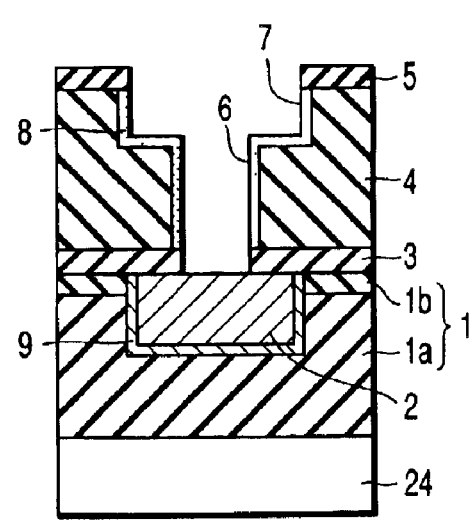
Figure 1C:
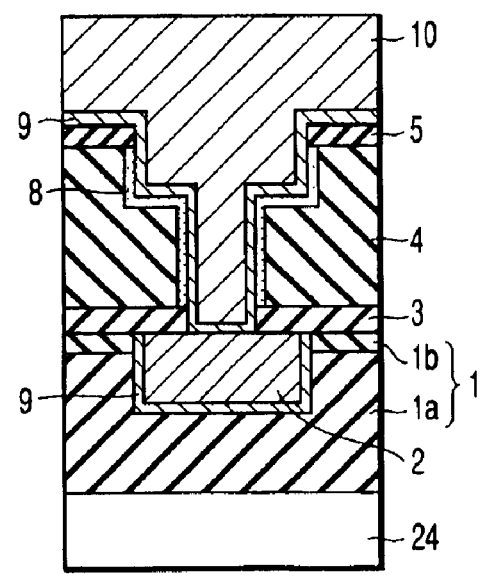
Figure 2:
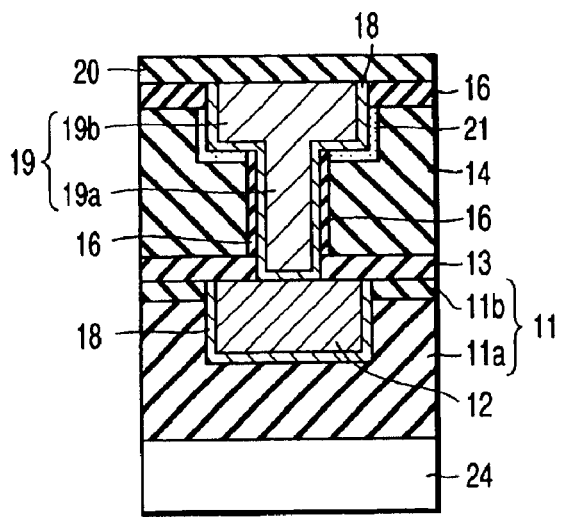
FIG. 2 is a cross-sectional view of a wiring structure of a semiconductor device according to a first embodiment of the present invention.

FIG. 2 is a cross-sectional view of a wiring structure of a semiconductor device according to a first embodiment of the present invention.

In the semiconductor device shown in FIG. 2, an insulation layer 11 is formed on a semiconductor substrate 24, and a lower wiring layer 12 is buried in the insulation layer 11 with a barrier metal layer 18 interposed therebetween. The insulation layer 11 has a laminated structure of a low dielectric constant insulation film 11a as will be described below and a high strength insulation film 11b having a high fracture strength and serving as a cap layer, such as a silicon oxide film, a silicon nitride film and a silicon carbide film. However, the insulation layer 11 can be formed of a single layer. A silicon nitride film 13 (whose relative dielectric constant is 7.0 and Young's modulus is 100 GPa) acting as an etching stopper layer is formed on the insulation layer 11 and a low dielectric constant insulation film 14 is formed on the silicon nitride film 13. The film 14 can be made of, for example, $SiO(CH_3)_x$ (whose relative dielectric constant is 2.5 and Young's modulus is 10 GPa or lower). The film 14 can also be made of hydrogen silsesquioxane, a carbon-contained $SiO_2$ film (SiOC), a porous silica film, a polymer film, an (fluorine-doped) amorphous carbon film, or the like. The Young's modulus of these materials is about 10 GPa or lower.

An upper wiring layer 19b is buried in the low dielectric constant insulation film 14 and connected to the lower wiring layer 12 through a plug 19a. The upper wiring layer 19b and plug 19a have a barrier metal layer 18 on their surfaces. The barrier metal layer 18 can be made of Ta, Ti, Nb, an alloy containing the elements, a compound of the elements, or a laminated film of the elements. The conductive layer 19 such as the upper wiring layer 19b and plug 19a can be formed of Cu, Al, or an alloy containing these elements.

A high Young's modulus insulation film 16 whose Young's modulus is 15 GPa or higher is formed between the barrier metal layer 18 formed on the side of the plug 19a and the low dielectric constant interlayer insulation film 14. The insulation film 16 can be formed of a silicon oxide (SiO) film (whose relative dielectric constant is 4.0 and Young's modulus is 60 GPa), a silicon nitride (SiN) film (whose relative dielectric constant is 7.0 and Young's modulus is 100 GPa), or the like. The film 16 can also be formed of a silicon oxynitride (SiON) film (whose relative dielectric constant is 4.0 to 5.0 and Young's modulus is 80 GPa to 100 GPa), a silicon carbonitride (SiCN) film (whose relative dielectric constant is 4.0 to 5.0 and Young's modulus is 100 GPa).

Figure 3:
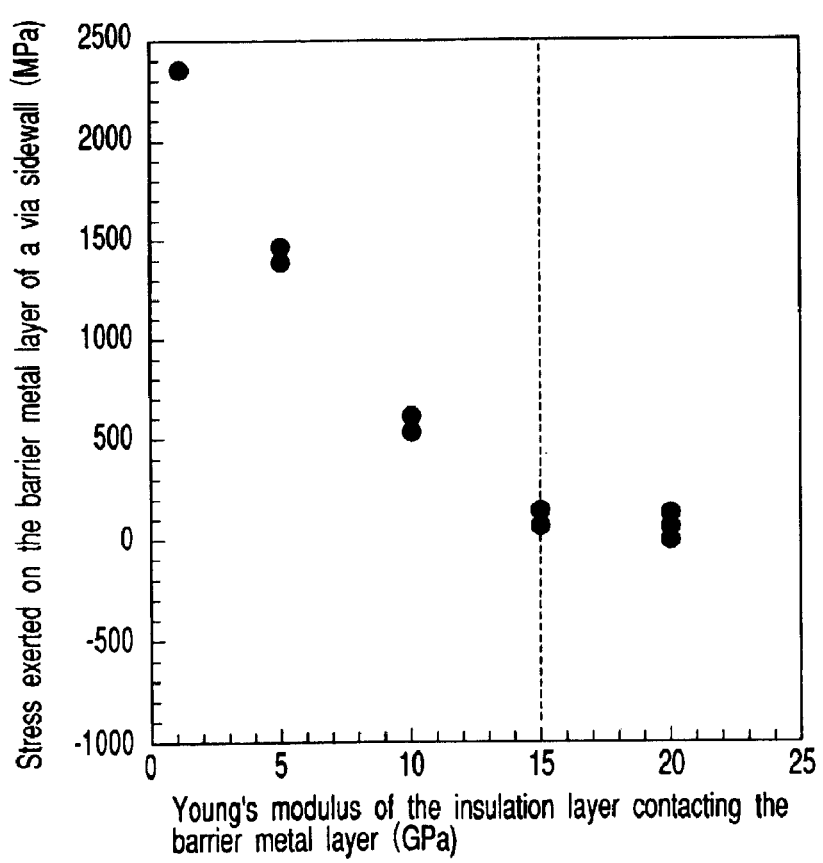
FIG. 3 is a graph showing computation results of stress exerted on a barrier metal layer of a via sidewall, which are obtained by simulation.

FIG. 3 is a graph showing computation results of stress exerted on the barrier metal layer of a via sidewall, which are obtained by simulation. As is apparent from FIG. 3, the stress exerted on the barrier metal layer increases suddenly when the Young's modulus of the insulation layer contacting the barrier metal layer is lower than 15 GPa. The sudden increase in stress causes a crack to the barrier metal layer.

In the first embodiment, since the high Young's modulus insulation film having a Young's modulus of 15 GPa or higher is formed on the sidewall of the via hole, the stress on the barrier metal layer can be prevented from increasing. Since, moreover, the high Young's modulus insulation film has a high fracture strength, even though a crack occurs in the barrier metal layer, it is prevented from progressing to the low dielectric constant insulation film.

The effect of the high Young's modulus insulation film formed on the sidewall of the via hole can be produced if its thickness is at least 1 nm. If, however, the high Young's modulus insulation film is formed excessively thick, there is a fear that the dielectric constant of the interlayer insulation film will undesirably increase. It is thus desirable that the upper limit of the thickness be at most 100 nm.

In the wiring structure shown in FIG. 2, the high Young's modulus insulation film 16 is also formed on the low dielectric constant insulation film 14 and serves as a cap layer. A silicon nitride film 20 is provided on the high Young's modulus insulation film 16 and upper wiring layer 19b.

A method for forming the wiring structure shown in FIG. 2 will be described with reference to FIGS. 4A to 4E.

Figure 4A:
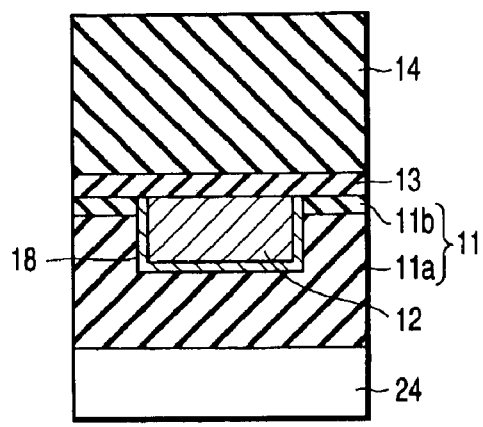
FIGS. 4A to 4E are cross-sectional views of steps of manufacturing the wiring structure of the semiconductor device according to the first embodiment of the present invention.

Referring first to FIG. 4A, a low dielectric constant insulation film 11a and a high strength insulation layer 11b are deposited in sequence on a semiconductor substrate 24 to form an insulation film 11, and a lower wiring layer 12 having a barrier metal layer 18 on its surface is buried in the insulation film 11. Further, a silicon nitride film 13 serving as an etching stopper film is formed by plasma CVD and a low dielectric constant insulation film 14 is formed by spin coating using, e.g., $SiO(CH_3)_x$.

Figure 4B:
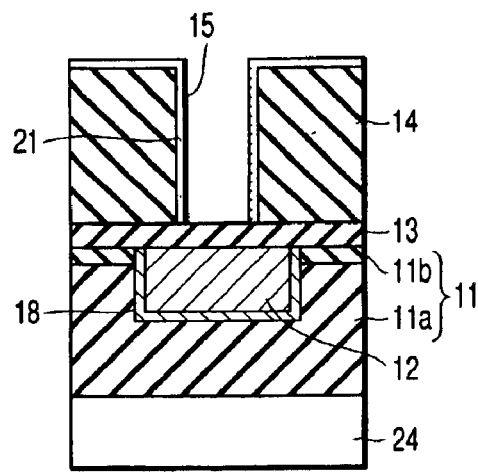

As shown in FIG. 4B, a via hole 15 is formed in the low dielectric constant insulation film 14 by RIE. The RIE causes a damaged layer 21 to be formed on the surface of the insulation film 14.

Figure 4C:
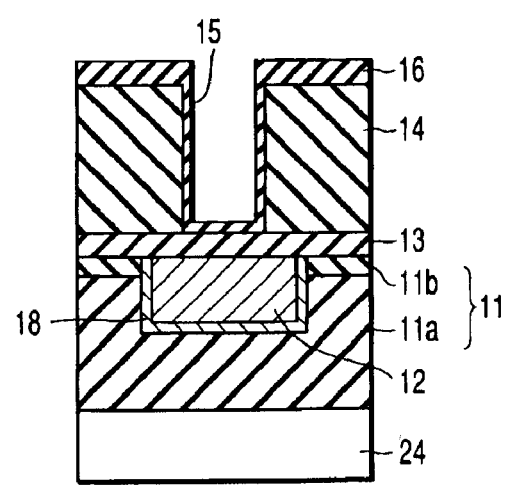

The damaged layer 21 so formed is removed by wet etching using hydrofluoric acid. Then, a silicon oxide film serving as a high Young's modulus insulation film 16 is formed by plasma CVD on the entire surface of the low dielectric constant insulation film 14 in which the via hole 15 is formed, as shown in FIG. 4C. The silicon oxide film has a Young's modulus of 60 GPa and a thickness of 50 nm.

Figure 4D:
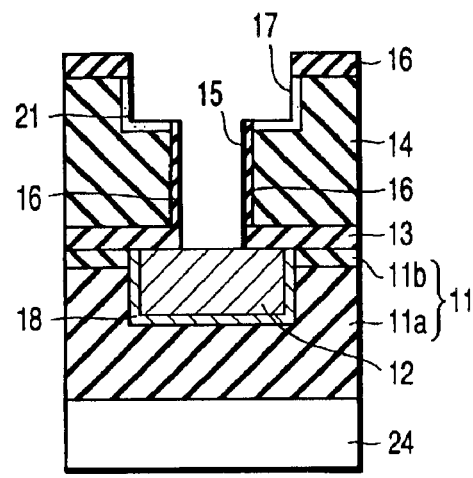

As illustrated in FIG. 4D, a wiring groove 17 is formed by RIE in a region including the via hole 15 of the low dielectric constant insulation film 14 and the high Young's modulus insulation film 16. By forming the wiring groove 17, the high Young's modulus insulation film 16 is removed from the bottom of the via hole 15 but remains on the low dielectric constant insulation film 14. The remaining film serves as a cap layer. The RIE causes a damaged layer 21 to be formed on the surface of the insulation film 14 on the sidewall and bottom of the wiring groove 17, which does not become a problem in particular. After that, the silicon nitride film 13 is removed from the bottom of the via hole 15 by RIE to expose the surface of the lower wiring layer 12.

Figure 4E:
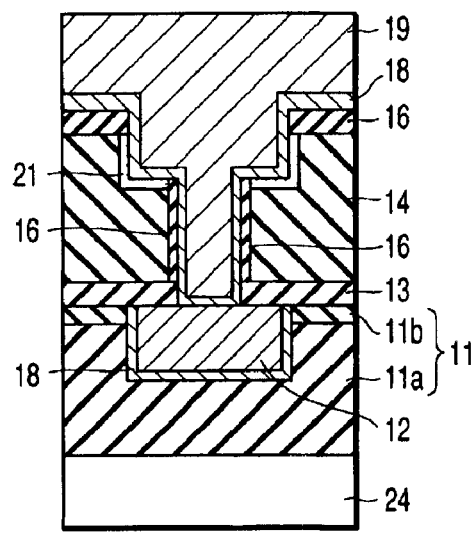

As depicted in FIG. 4E, one of Ta, Ti, Nb, TaN, TiN and NbN or a laminated film containing two or more of these elements is deposited on the entire surface of the resultant structure at about 150° C. to form a barrier metal layer 18. Furthermore, Cu acting as a plating seed is deposited and then Cu as a conductive material is deposited by plating to bury a conductive layer 19 into the via hole 15 and wiring groove 17. After that, the resultant structure is annealed at about 400° C. in a forming gas.

Finally, the barrier metal layer 18 and conductive layer 19 are removed by CMP from a region on the low dielectric constant insulation film 14 excluding the wiring groove 17. A silicon nitride film 20 is formed on the entire surface of the resultant structure by plasma CVD, thereby obtaining a wiring structure as shown in FIG. 2.

Figure 5:
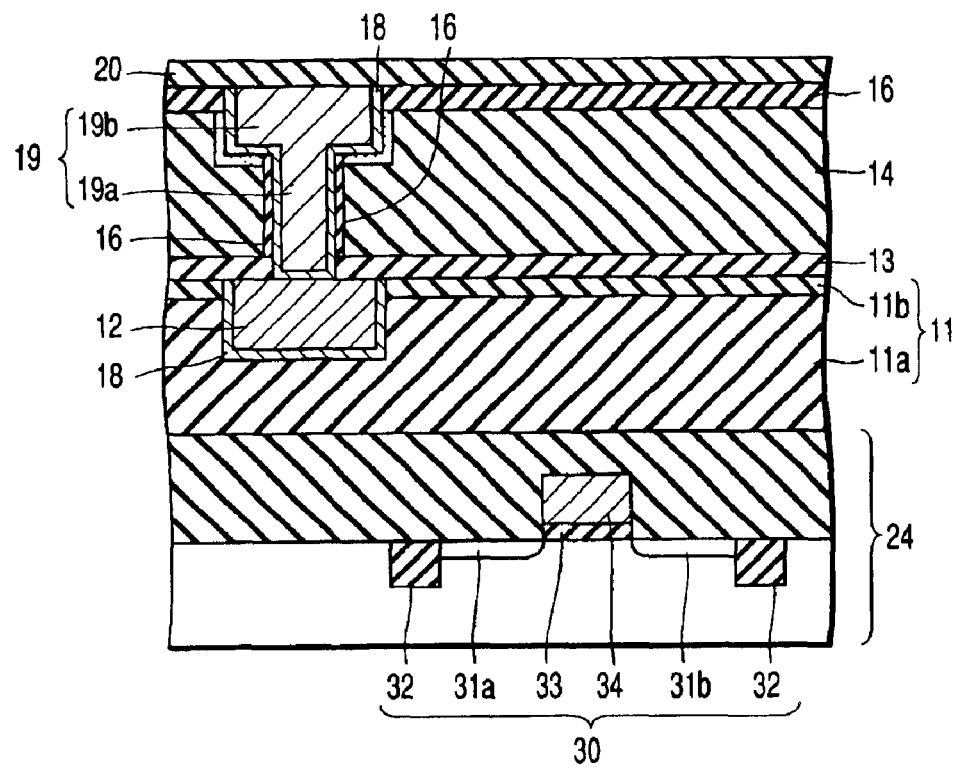
FIG. 5 is a cross-sectional view showing part of the semiconductor device according to the first embodiment of the present invention.

FIG. 5 shows part of a semiconductor device having a wiring structure as described above. In this semiconductor device, source and drain regions 31a and 31b are formed apart from each other in the region of a semiconductor substrate 24 that is interposed between element isolating insulation films 32. A gate insulation film 33 is formed between the source and drain regions 31a and 31b and a gate electrode 34 is formed on the gate insulation film 33. The source and drain regions 31a and 31b, element isolating insulation films 32, gate insulation film 33, and gate electrode 34 make up an active element 30 in the semiconductor substrate 24. The same wiring structure as shown in FIG. 2 is provided on this semiconductor substrate 24.

In the wiring structure of the semiconductor device shown in FIG. 5, the sidewall of the via hole, which is most likely to be cracked, is covered with the high Young's modulus insulation film 16 having a Young's modulus of 15 GPa or higher, as has been described above. Thermal stress is therefore prevented from being exerted on the barrier metal layer 18. Since, moreover, the damaged layer is eliminated, the sidewall of the via hole includes no low fracture strength region. The high Young's modulus insulation film 16 formed on the sidewall of the via hole has a high fracture strength as described above. Consequently, the low dielectric constant insulation film 14 is not cracked even through the annealing step and its subsequent sintering step.

(Second Embodiment)

FIGS. 6A to 6F are cross-sectional views of steps of forming a wiring structure of a semiconductor device according to a second embodiment of the present invention.

Figure 6A:
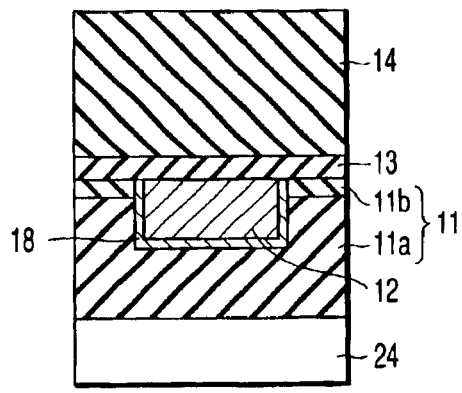
FIGS. 6A to 6F are cross-sectional views of steps of manufacturing a wiring structure of a semiconductor device according to a second embodiment of the present invention.

As illustrated in FIG. 6A, a lower wiring layer 12 buried in an insulation film 11, a silicon nitride film 13 acting as an etching stopper film, and a low dielectric constant insulation film 14 are formed in sequence on a semiconductor substrate 24 by the same technique as that of the foregoing first embodiment.

Figure 6B:
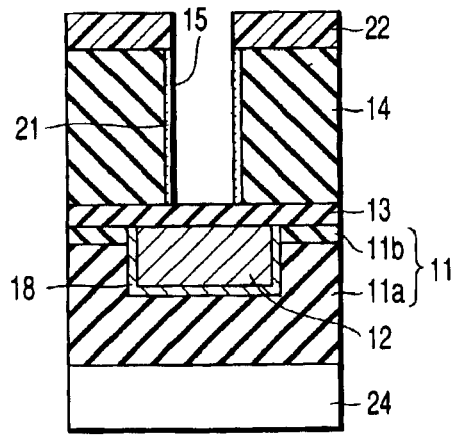

As depicted in FIG. 6B, a via hole 15 is formed in the insulation film 14 by RIE using a resist pattern 22 as an etching mask. The RIE causes a damaged layer 21 to be formed on the surface of the insulation film 14.

Figure 6C:
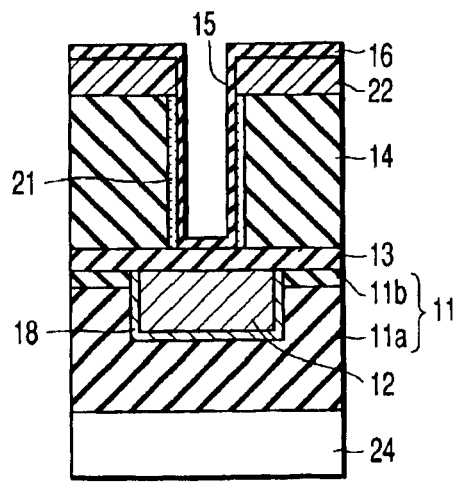

Before the resist pattern 22 is removed, as shown in FIG. 6C, a high Young's modulus insulation film 16 having a Young's modulus of 15 GPa or higher is formed on the entire surface of the resultant structure by plasma CVD. The high Young's modulus insulation film 16 can be formed of a silicon oxide film or a silicon nitride film, as has been described above. Before the insulation film 16 is formed, the damaged layer 21 can be removed from the surface of the low dielectric constant insulation film 14 by the same technique as that of the first embodiment.

Figure 6D:
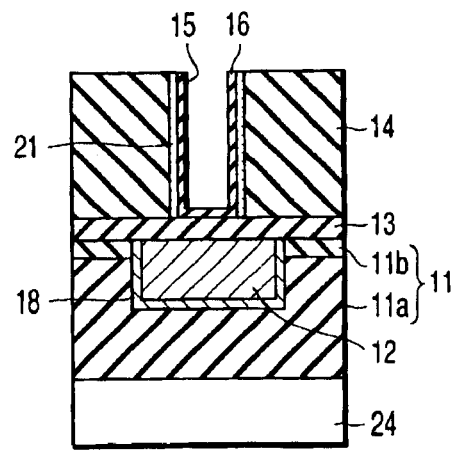
Figure 6E:
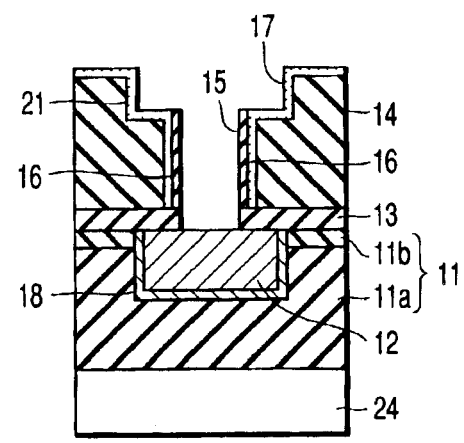

The resist pattern 22 and the high Young's modulus insulation film 16 formed thereon are removed by lift-off as shown in FIG. 6D. After that, a wiring groove 17 is formed in the low dielectric constant insulation film 14 by RIE as shown in FIG. 6E. The RIE causes a damaged layer 21 to be formed on the insulation film 14 on the sidewall and bottom of the wiring groove 17, which does not become a problem. After that, the silicon nitride film 13 is removed from the bottom of the via hole 15 by RIE to expose the surface of the lower wiring layer 12.

Figure 6F:
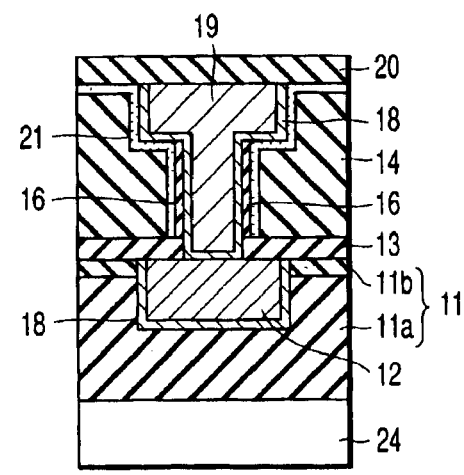

After the barrier metal layer 18 and conductive layer 19 are buried in the via hole 15 and wiring groove 17 by the same technique as that of the first embodiment, a silicon nitride film 20 is formed on the entire surface of the resultant structure, thereby obtaining a wiring structure as shown in FIG. 6F.

In the semiconductor device having the above wiring structure, the sidewall of the via hole, which is most likely to be cracked, is covered with the high Young's modulus insulation film 16 having a Young's modulus of 15 GPa or higher. Thermal stress is therefore prevented from being exerted on the barrier metal layer 18. Since, moreover, the insulation film 16 has high fracture strength, the low dielectric constant insulation film 14 is not cracked even through the annealing step and its subsequent sintering step.

(Third Embodiment)

Figure 7:
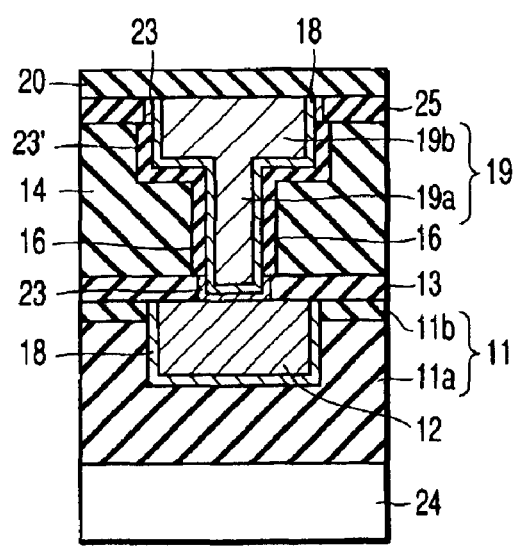
FIG. 7 is a cross-sectional view showing an example of a wiring structure of a semiconductor device according to a third embodiment of the present invention.

FIG. 7 is a cross-sectional view showing a wiring structure of a semiconductor device according to a third embodiment of the present invention.

In the wiring structure shown in FIG. 7, an insulation layer 11 is provided on a semiconductor substrate 24. A lower wiring layer 12 is buried in the insulation layer 11. The insulation layer 11 has a laminated structure of a low dielectric constant insulation film 11a and a high strength insulation film 11b. A silicon nitride film 13 (whose relative dielectric constant is 7.0 and Young's modulus is 100 GPa) acting as an etching stopper layer is formed on the insulation layer 11 and a low dielectric constant insulation film 14 is formed on the silicon nitride film 13. The insulation film 14 can be made of, for example, $SiO(CH_3)_x$ (whose relative dielectric constant is 2.5 and Young's modulus is 10 GPa or lower). The insulation film 14 can also be made of oxide materials such as hydrogen silsesquioxane, carbon-contained $SiO_2$ (SiOC), and porous silica.

An upper wiring layer 19b is buried in the low dielectric constant insulation film 14 and connected to the lower wiring layer 12 through a plug 19a. The upper wiring layer 19b and plug 19a have a barrier metal layer 18 on their surfaces. A high Young's modulus insulation film 23' is formed at an interface between the insulation film 14 and barrier metal layer 18. The insulation film 23' is a metal oxide layer having a Young's modulus of 15 GPa or higher.

The metal oxide layer is an oxide containing at least one metal selected from the group consisting of Ta, Ti, Nb and Al. As will be described below, the metal oxide layer can be formed by sputtering at high temperature or annealing after a metal film is formed. Since such a metal oxide layer has a high Young's modulus of about 100 GPa to 200 GPa, it can prevent the stress exerted on the barrier metal layer from increasing if it is formed on the sidewall of the via hole. Since, moreover, the metal oxide layer so formed has a high fracture strength as the silicon oxide film and silicon nitride film do, even though a crack occurs in the barrier metal layer 18, it can be prevented from progressing to the low dielectric constant insulation film 14.

For the reasons described above, it is desirable that the thickness of the high Young's modulus insulation film 23' range from 1 nm to 100 nm.

In the wiring structure shown in FIG. 7, a silicon oxide film 25 is formed on the low dielectric constant insulation film 14 and a silicon nitride film 20 is formed on the silicon oxide film 25.

A method for forming the wiring structure shown in FIG. 7 will now be described with reference to FIGS. 8A to 8E.

Figure 8A:
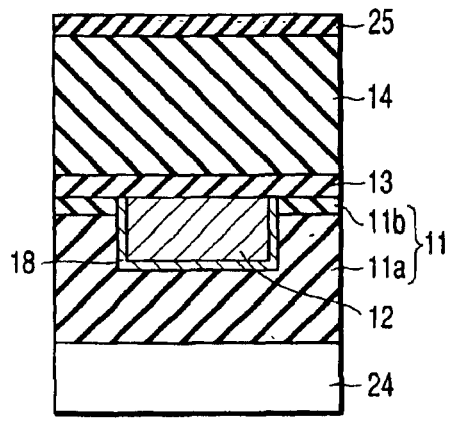
FIGS. 8A to 8E are cross-sectional views of steps of manufacturing the wiring structure of the semiconductor device according to the third embodiment of the present invention.

As illustrated in FIG. 8A, a lower wiring layer 12 buried in an insulation film 11, a silicon nitride film 13 acting as an etching stopper film, and a low dielectric constant insulation film 14 are formed by the same technique as that of the foregoing first embodiment. A silicon oxide film 25 acting as a cap layer is formed on the insulation film 14 by plasma CVD.

Figure 8B:
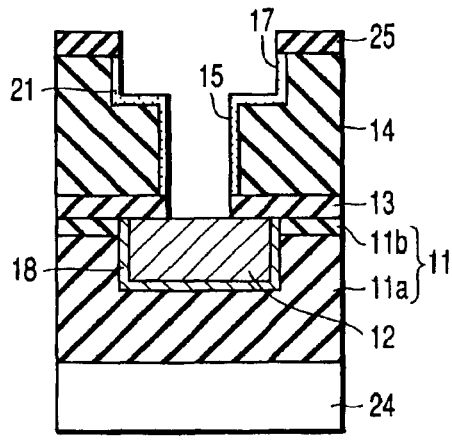

As depicted in FIG. 8B, a via hole 15 connected to the lower wiring layer 12 and a wiring groove 17 are formed by RIE in an insulation layer including the silicon nitride film 13, low dielectric constant insulation film 14, and silicon oxide film 25. The RIE causes a damaged layer 21 to be formed on the surface of the insulation film 14.

Figure 8C:
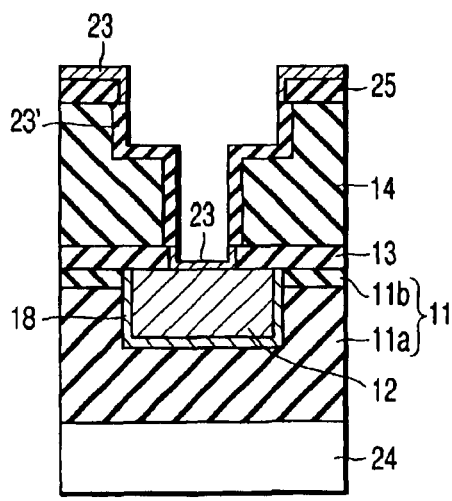

A high Young's modulus insulation film 23' is formed at the region of the damaged layer 21 as illustrated in FIG. 8C. The insulation film 23' is a metal oxide layer containing Ta, Ti, Nb or Al. A metal oxide layer containing Ta, Ti or Nb can be formed by sputtering Ta, Ti or Nb at a temperature of about 300° C. to 450° C. in a vacuum. Due to the high temperature sputtering, such metal is diffused into the damaged layer 21 of the low dielectric constant insulation film 14 and reacts with the insulation film 14 to form a high Young's modulus insulation film 23' that is made of a metal oxide layer. On the other hand, a metal oxide layer containing Al is formed by forming an Al film by sputtering or MOCVD and then annealing it at a temperature of about 100° C. to 450° C. The atmosphere of the sputtering and MOCVD is not limited, but they can be performed in a vacuum or a forming gas. Due to the annealing, Al is diffused into the damaged layer 21 of the low dielectric constant insulation film 14 and reacts with the insulation film 14 to form a high Young's modulus insulation film 23' that is made of a metal oxide layer.

The fact that the high Young's modulus insulation film 23' is formed on the surface of the low dielectric constant insulation film 14 means that the damaged layer 21 has disappeared. In either case, the above metal does not react with the bottom of the via hole 15 or the surface of the silicon oxide film 25, which corresponds to a region other than the low dielectric constant insulation film 14; therefore, a metal film 23 is formed as shown in FIG. 8C.

Ta, Ti and Nb each have Cu barrier properties. If, therefore, a metal oxide is formed while its thickness is controlled and a metal film is left on the surface of the metal oxide, it can be used as a barrier metal layer. Since Al has Cu barrier properties in an alumina state, a metal oxide layer itself can be used as a barrier layer. When all the deposited Al film is oxidized to form an alumina layer, Cu wiring can be buried without forming any additional barrier metal layer. This is very advantageous to a reduction in manufacturing steps. The Al film may remain on the surface of the metal oxide layer if the metal oxide layer has a required thickness.

Figure 8D:
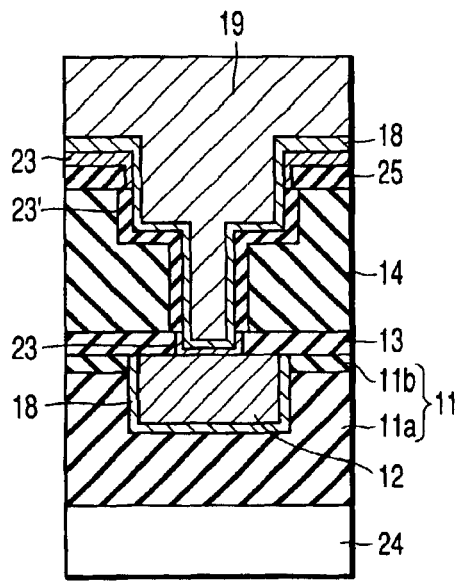

A barrier metal layer 18, which is to be formed as required, and a conductive layer 19 are buried in the via hole 15 and wiring groove 17 by the same technique as that of the first embodiment. After that, the resultant structure is annealed in a forming gas, thereby obtaining a structure as shown in FIG. 8D.

Figure 8E:
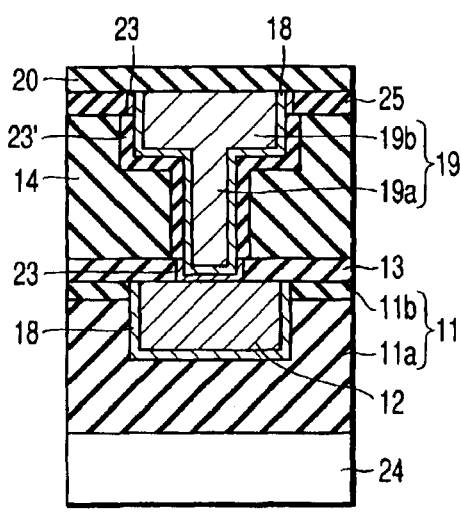

Finally, the barrier metal layer 18, conductive layer 19, and unreacted metal film 23, which are deposited on a region of the silicon oxide film 25 excluding the wiring groove 17, are removed by CMP, and a silicon nitride film 20 is formed on the entire surface of the resultant structure by plasma CVD, thereby forming a wiring structure as shown in FIG. 8E.

In the semiconductor device having the foregoing wiring structure, the sidewall of the via hole, which is most likely to be cracked, is covered with the high Young's modulus insulation film 23' made of a metal oxide whose Young's modulus is 15 GPa or higher. Thermal stress exerted on the barrier metal layer 18 is therefore prevented from increasing. Since the high Young's modulus insulation film 23' is formed by diffusion of metal in the damaged layer 21 whose fracture strength is low, the damaged layer 21 disappears and the insulation film 23' having a high fracture strength contacts the barrier metal layer 18. Consequently, the low dielectric constant insulation film 14 is not cracked even through the annealing step and its subsequent sintering step.

Figure 9:
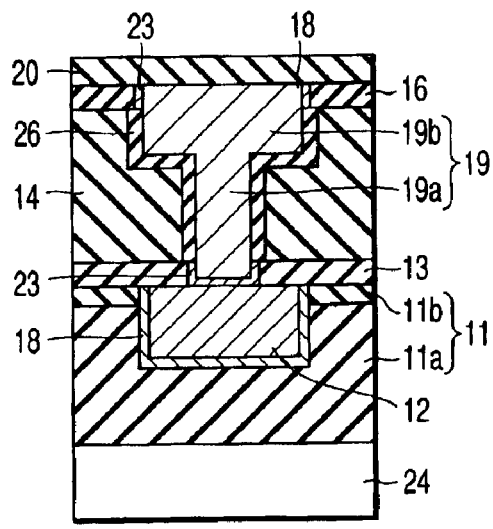
FIG. 9 is a cross-sectional view showing another example of the wiring structure of the semiconductor device according to the third embodiment of the present invention.

As has been described above, no additional barrier metal layers need to be formed if an Al film is deposited and completely oxidized to form an alumina layer when a high Young's modulus insulation film 23' is formed as shown in FIG. 8C. In other words, a high Young's modulus insulation film serving as a barrier layer can be formed by a single step. The wiring structure in this case is shown in FIG. 9. This wiring structure can be formed by the same technique as described above and differs from the foregoing structures only in that no barrier metal layer is formed. In the structure shown in FIG. 9, a high Young's modulus insulation film 26 that is made of a metal oxide (alumina) layer containing Al is formed in contact with the side of a plug 19a.

In the semiconductor device having the wiring structure so obtained, a damaged layer 21 disappears from the sidewall of the via hole, which is most likely to be cracked, and the sidewall is covered with the high Young's modulus insulation film 26 made of an alumina layer having a high fracture strength and a Young's modulus of 15 GPa or higher. Consequently, the low dielectric constant insulation film 14 is not cracked even through the annealing step and its subsequent sintering step.

Figure 10:
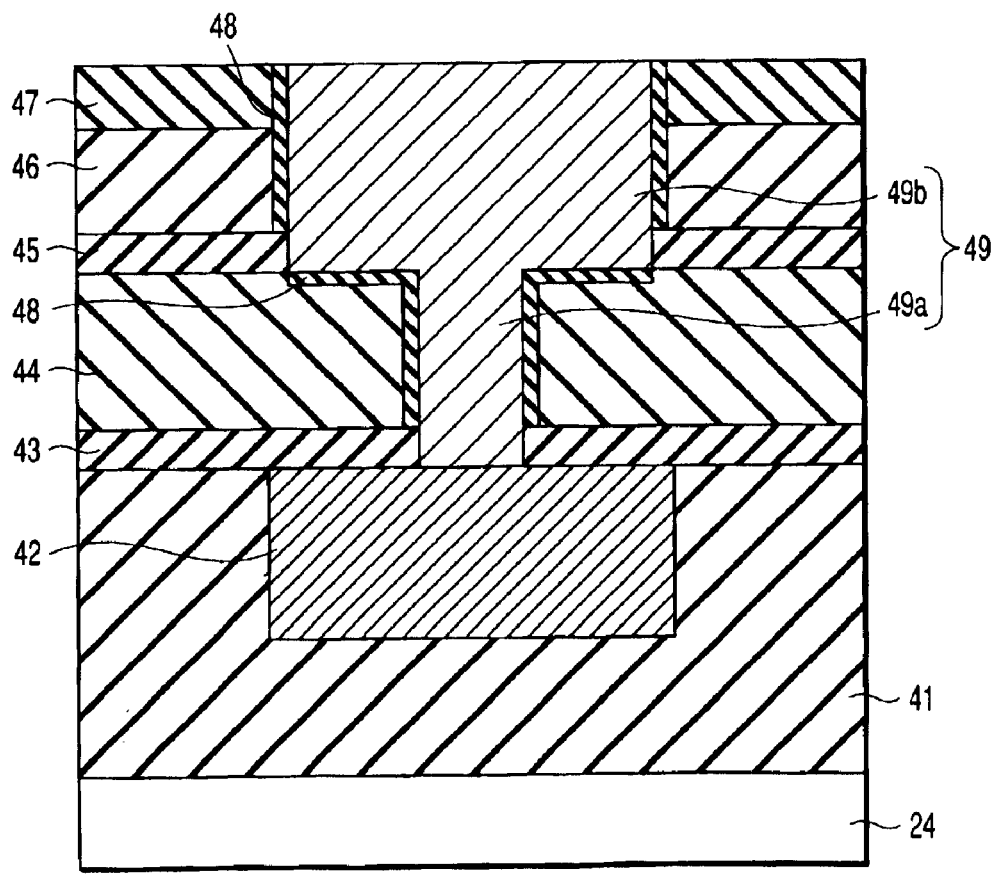
FIG. 10 is a cross-sectional view showing still another example of the wiring structure of the semiconductor device according to the third embodiment of the present invention.

The wiring structure shown in FIG. 9 can be modified as shown in FIG. 10.

In the wiring structure depicted in FIG. 10, an insulation layer 41 in which a lower wiring layer 42 is buried is provided on a semiconductor substrate 24. The insulation film 41 can have a laminated structure of a low dielectric constant insulation film and a high strength insulation film. The lower wiring layer 42 can have a barrier metal layer on its surface; otherwise, the surface of the insulation layer 41 that contacts the lower wiring layer 42 can serve as an alumina layer.

A stopper insulation film 43 made of a silicon carbonitride film, a low dielectric constant insulation film 44 made of a porous organosilicon oxide film, a mid-stopper layer 45 made of a silicon carbonitride film, a low dielectric constant insulation film 46 made of a porous organosilicon oxide film, and a cap insulation film 47 made of an organosilicon oxide film are formed on the insulation layer 41 in the order designated.

In this laminated structure, an upper wiring layer 49b is buried and connected to the lower wiring layer 42 through a plug 49a. A high Young's modulus insulation film 48 made of alumina is formed between the conductive material such as the upper wiring layer 49b and the plug 49a and the insulation film such as the low dielectric constant insulation film 46, cap insulation film 47 and the low dielectric constant insulation film 44.

A method for forming the wiring structure shown in FIG. 10 will now be described with reference to FIGS. 11A to 11E.

A wiring layer 42 buried in an insulation film 41, a stopper insulation film 43 made of a silicon carbonitride film, a low dielectric constant insulation film 44 made of a porous organosilicon oxide film, a mid-stopper layer 45 made of a silicon carbonitride film, and a low dielectric constant insulation film 46 made of a porous organosilicon oxide film are formed in the order designated. An organosilicon oxide film 47 acting as a cap layer is formed on the low dielectric constant insulation film 46.

Figure 11A:
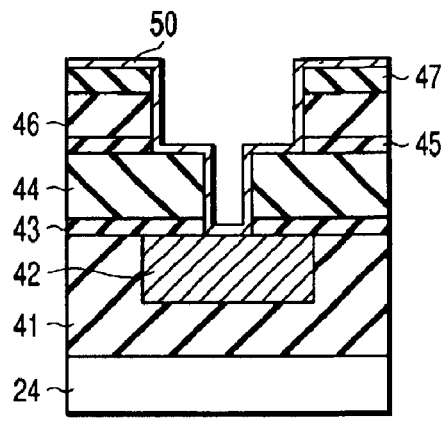
FIGS. 11A to 11E are cross-sectional views of steps of manufacturing the wiring structure of the semiconductor device shown in FIG. 10.

Then, a via hole connected to the lower wiring layer 42 and a wiring groove are formed in the insulation films by RIE using the stopper insulation film 43 and mid-stopper layer 45 as etching stoppers, respectively. As has been described above, a damaged layer (not shown) is formed on the surfaces of the low dielectric constant insulation films 44 and 46. In this step, when the stopper insulation film 43 is removed from the bottom of the via hole, the mid-stopper layer 45 is also removed from the bottom of the wiring groove. After that, an Al film 50 is formed on the entire surface of the resultant structure as shown in FIG. 11A by the same technique as that of the third embodiment.

Figure 11B:
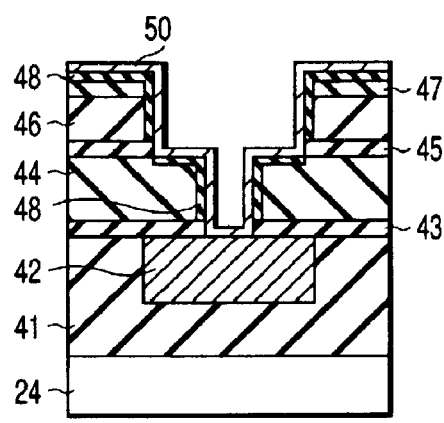

After that, a high Young's modulus insulation film 48 made of an alumina layer is formed at an interface between the Al film 50 and each of the low dielectric constant insulation films 44 and 46 by annealing, as shown in FIG. 11B. The high Young's modulus insulation film 48 is formed on the top surface and sides of the cap layer 47 since the cap layer 47 is made of organosilicon oxide.

Figure 11C:
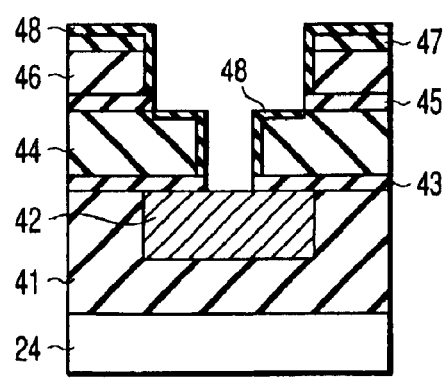

Then, unreacted aluminum (Al) is removed by wet etching to expose the high Young's modulus insulation film 48 as illustrated in FIG. 11C. The sidewalls of the wiring groove and via hole have regions at which the stopper layers 43 and 45 are exposed, and these regions have Cu barrier properties.

Figure 11D:
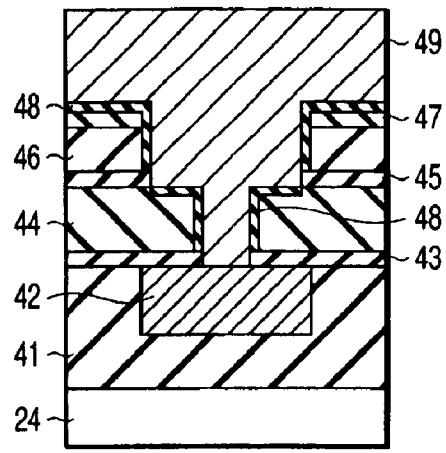
Figure 11E:
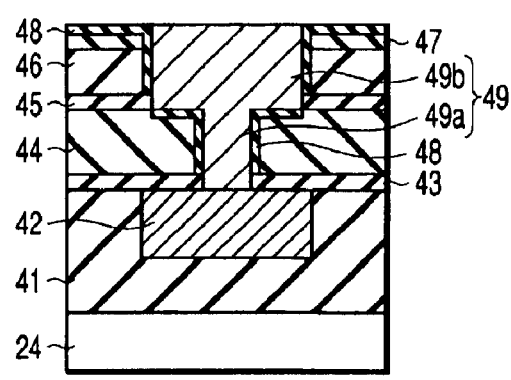

After that, a Cu seed film (not shown) is formed on the entire surface of the resultant structure and, as shown in FIG. 11D, a conductive layer 49 is buried in the Cu seed film by Cu electrolytic plating. The conductive layer 49 deposited on the region other than the groove is eliminated by CMP as shown in FIG. 11E. Finally, the high Young's modulus insulation film 48 is removed from the top surface of the cap layer 47 by CMP, thereby obtaining the wiring structure as shown in FIG. 10.

In the wiring structure shown in FIG. 10, the high Young's modulus insulation film 48 is formed on the bottom of the wiring groove and thus the adhesion between the upper wiring layer 49b and the interlayer insulation film 44 is improved. Comparing with the wiring structure shown in FIG. 9, no Al film is formed on the bottom of the via hole and thus the following advantage is obtained. The resistance of an interface between the lower wiring layer 42 and the via plug 49a decreases and the conductive materials of the upper and lower wiring layers are not separated by different materials, with the result that electromigration resistance and stress void resistance are improved.

Figure 12:
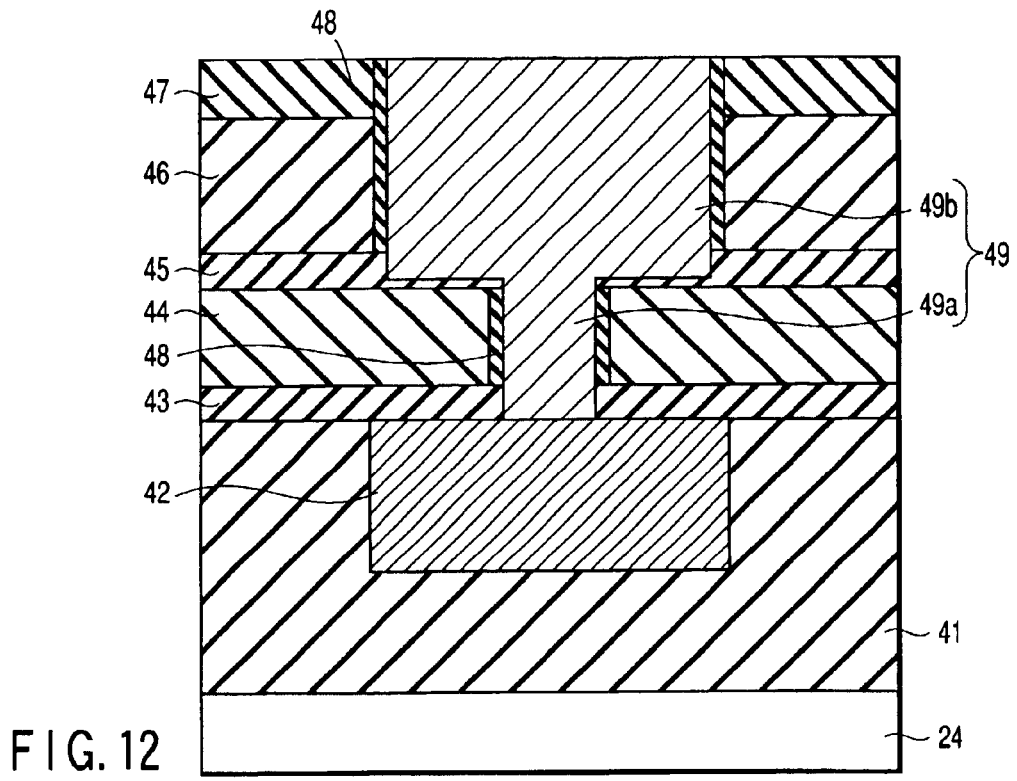
FIG. 12 is a cross-sectional view showing yet another example of the wiring structure of the semiconductor device according to the third embodiment of the present invention.

The wiring structure can also be modified as shown in FIG. 12.

The wiring structure shown in FIG. 12 is the same as that shown in FIG. 10, except that a mid-stopper layer 45 made of a silicon carbonitride film is formed on the bottom of the upper wiring layer 49b.

A method for forming the wiring structure shown in FIG. 12 will now be described with reference to FIGS. 13A to 13E.

In the first step, insulation layers 41, 43, 44, 45, 46 and 47 are formed by the same technique as described in the case of FIG. 11A, except that the mid-stopper layer 45 is thickened, then a via hole and a wiring groove are formed by RIE. Since the mid-stopper layer 45 is thick, it is not completely eliminated but remains when the insulation film 43 is removed from the bottom of the via hole. After that, an Al film 50 is formed on the entire surface of the resultant structure by the same technique as described above, as shown in FIG. 13A.

Figure 13A:
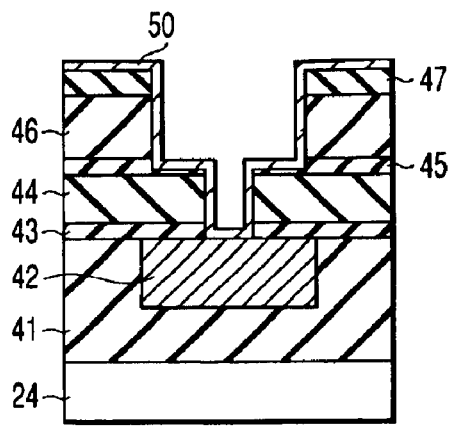
FIGS. 13A to 13E are cross-sectional views of steps of manufacturing the wiring structure of the semiconductor device shown in FIG. 12.
Figure 13B:
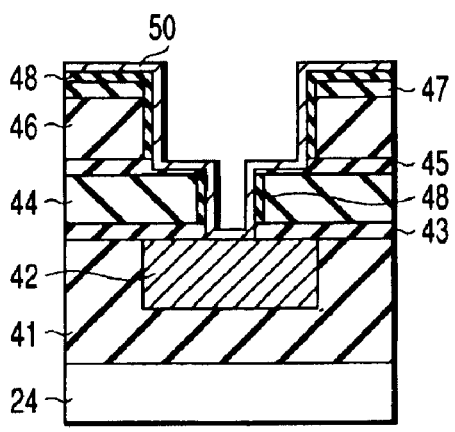

After that, a high Young's modulus insulation film 48 made of an alumina layer is formed at an interface between the Al film 50 and each of the insulation films 44 and 46 by annealing, as shown in FIG. 13B. The high Young's modulus insulation film 48 is formed on the top surface and sides of the cap insulation layer 47 since the layer 47 is made of organosilicon oxide.

Figure 13C:
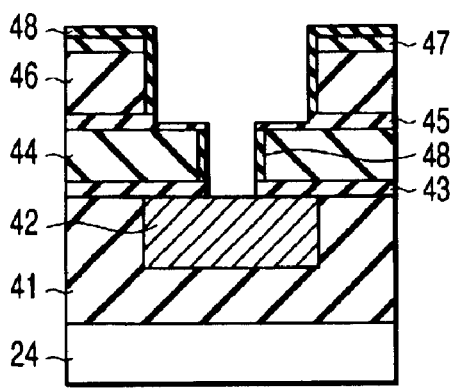
Figure 13D:
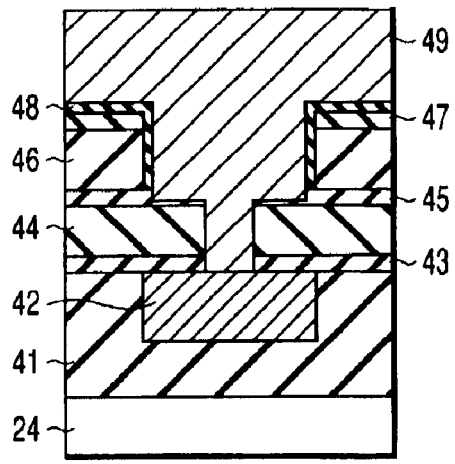
Figure 13E:
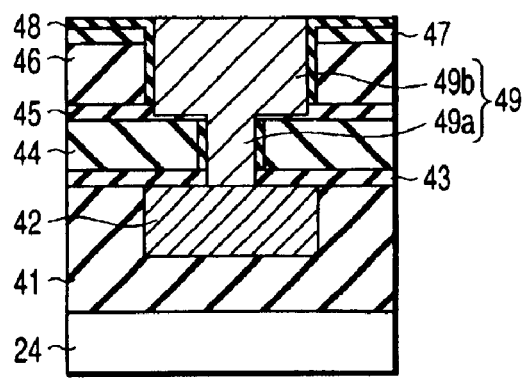

Then, unreacted aluminum (Al) is removed by wet etching to expose the high Young's modulus insulation film 48 as illustrated in FIG. 13C. Moreover, a conductive layer 49 is formed by the same technique as described above as shown in FIG. 13D and removed from the region other than the groove as shown in FIG. 13E. Finally, the high Young's modulus insulation film 48 is removed from the top surface of the insulation layer 47 to obtain the wiring structure shown in FIG. 12.

In the wiring structure shown in FIG. 12, the mid-stopper layer 45 made of a silicon carbonitride film is formed on the bottom of the wiring groove. Since the silicon carbide film has a dielectric constant that is lower than that of alumina, it is advantageous to a high-speed operation of an LSI.

Figure 14:
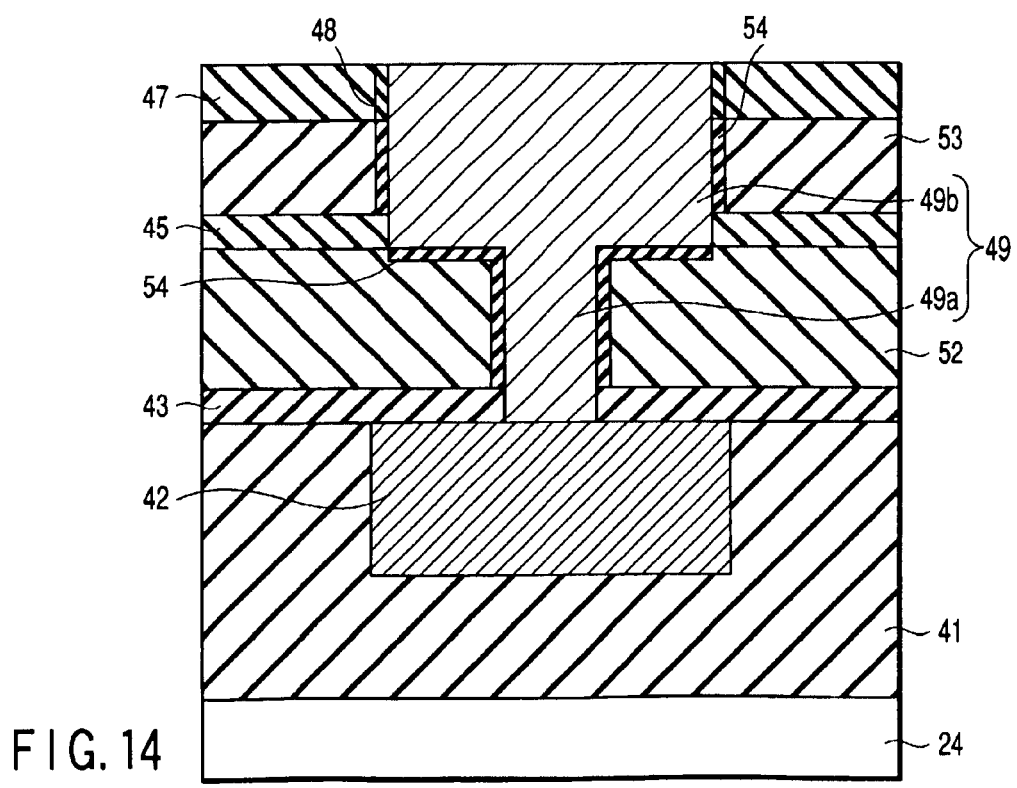
FIG. 14 is a cross-sectional view showing yet another example of the wiring structure of the semiconductor device according to the third embodiment of the present invention.

The wiring structure can also be modified as shown in FIG. 14.

The wiring structure shown in FIG. 14 is the same as that shown in FIG. 10, except that low dielectric constant insulation films 52 and 53 are made of an aromatic hydrocarbon polymer and a high Young's modulus insulation film 54 made of aluminum carbide is formed at an interface between a Cu conductive layer 49 and each of the insulation films 52 and 53. In other words, the wiring structure can be manufactured by the same technique as that for manufacturing the structure shown in FIGS. 11A to 11E, except that a low dielectric constant insulation film is formed using an aromatic hydrocarbon polymer. Aluminum (Al) reacts with the aromatic hydrocarbon polymer to form a high Young's modulus insulation film 54 made of aluminum carbide.

Like alumina, the aluminum carbide has a Young's modulus of 15 GPa or higher and Cu barrier properties. It can therefore be used as a barrier layer of Cu wiring.

As has been described in detail, according to an aspect of the present invention, there is provided a semiconductor device capable of operating at high speed without causing any short circuit and a method for manufacturing the semiconductor device.

The present invention is very effective at forming a multilayer wiring structure using a low dielectric constant insulation film and its industrial significance is very great.

What is claimed is:

1. A semiconductor device comprising:
   a semiconductor substrate on which an element is formed;
   a low dielectric constant insulation film formed over said semiconductor substrate and having a relative dielectric constant of 3 or lower;
   a conductive layer including a plug and a wiring layer buried in said low dielectric constant insulation film; and
   a high Young's modulus insulation film having a Young's modulus of 15 GPa or higher and formed selectively in a region between said low dielectric insulating film and said conductive layer, said high Young's modulus insulation film being located between said low dielectric constant insulation film and said plug and in contact with a side surface of said plug, and isolating the low dielectric constant insulation film from the plug.

2. The semiconductor device according to claim 1, wherein said high Young's modulus insulation film comprises one of a silicon oxide film and a silicon nitride film, and said plug has a barrier metal layer on a surface thereof.

3. The semiconductor device according to claim 1, further comprising a cap layer formed on said low dielectric constant insulation film and including a high Young's modulus insulation film having a Young's modulus of 15 GPa or higher.

4. The semiconductor device according to claim 1, wherein said high Young's modulus insulation film comprises a metal oxide layer containing at least one metal selected from a group consisting of Ta, Ti, Nb and Al.

5. The semiconductor device according to claim 4, wherein said high Young's modulus insulation film comprises a metal oxide layer containing at least one metal selected from a group consisting of Ta, Ti and Nb, and said plug has a barrier metal layer on a surface thereof.

6. The semiconductor device according to claim 4, wherein said high Young's modulus insulation film comprises alumina and said plug comprises copper.

7. The semiconductor device according to claim 1, wherein said low dielectric constant insulation film has a Young's modulus of lower than 15 GPa.

8. The semiconductor device according to claim 1, wherein said high Young's modulus insulation film formed in contact with a side of said plug has a thickness ranging from 1 nm to 100 nm.

9. The semiconductor device according to claim 1, wherein said wiring layer is formed on said low dielectric constant insulating film, without interposing said high Young's modulus insulation film therebetween.

10. The semiconductor device according to claim 9, wherein said high Young's modulus insulation film comprises one of a silicon oxide film and a silicon nitride film, and said plug has a barrier metal layer on a surface thereof.

11. The semiconductor device according to claim 9, further comprising a cap layer formed on said low dielectric constant insulation, said cap layer having a Young's modulus of 15 GPa or higher.

12. The semiconductor device according to claim 9, wherein said high Young's modulus insulation film comprises a metal oxide layer containing at least one metal selected from a group consisting of Ta, Ti, Nb, and Al.

13. The semiconductor device according to claim 12, wherein said high Young's modulus insulation film comprises a metal oxide layer containing at least one metal selected from a group consisting of Ta, Ti, and Nb, and said plug has a barrier metal layer on a surface thereof.

14. The semiconductor device according to claim 12, wherein said high Young's modulus insulation film comprises alumina and said plug comprises copper.

15. The semiconductor device according to claim 9, wherein said low dielectric constant insulation film has a Young's modulus of lower than 15 GPa.

16. The semiconductor device according to claim 9, wherein said high Young's modulus insulation film formed in contact with a side of said plug has a thickness ranging from 1 nm to 100 nm.

* * * * *